(12) United States Patent
Kim

(10) Patent No.: US 7,060,616 B2
(45) Date of Patent: Jun. 13, 2006

(54) METHOD OF MANUFACTURING SEMICONDUCTOR DEVICE

(75) Inventor: Ui Sik Kim, Seoul (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 164 days.

(21) Appl. No.: 10/731,481

(22) Filed: Dec. 10, 2003

(65) Prior Publication Data

US 2005/0014367 A1     Jan. 20, 2005

(30) Foreign Application Priority Data

Jul. 18, 2003   (KR) ................ 10-2003-0049426

(51) Int. Cl.
*H01L 21/4763*   (2006.01)
*H01L 21/44*   (2006.01)
(52) U.S. Cl. ............... 438/682; 438/649; 438/651
(58) Field of Classification Search ........... 438/197, 438/664, 682, 535, 607, 530, 533, 706, 721, 438/906, 649, 651, 592, 585
See application file for complete search history.

(56) References Cited

U.S. PATENT DOCUMENTS

| | | | |
|---|---|---|---|
| 5,536,684 A | * | 7/1996 | Dass et al. ............... 438/535 |
| 6,284,662 B1 | * | 9/2001 | Mikagi ................. 438/706 |
| 6,444,578 B1 | | 9/2002 | Cabral, Jr. et al. |
| 6,815,275 B2 | * | 11/2004 | Kwon et al. ............ 438/197 |
| 2002/0115262 A1 | | 8/2002 | Cabral, Jr. et al. |
| 2003/0057553 A1 | | 3/2003 | DelaRosa et al. |

FOREIGN PATENT DOCUMENTS

JP          2001352058       12/2001

* cited by examiner

*Primary Examiner*—Walter L. Lindsay, Jr.
(74) *Attorney, Agent, or Firm*—Mayer, Brown, Rowe & Maw LLP

(57) ABSTRACT

The present invention is provided to manufacture a semiconductor device capable of preventing loss of dopants due to external diffusion thereof from a junction area by forming a cobalt mono-silicide film through a first RTP process, implanting ions not serving as a donor or an acceptor with a low energy and a low dose to make the film amorphous, and then forming a cobalt silicide film through a second RTP process.

17 Claims, 3 Drawing Sheets

METHOD OF MANUFACTURING SEMICONDUCTOR DEVICE

BACKGROUND

1. Field of the Invention

The present invention relates to a method of manufacturing a semiconductor device and, more specifically, to a method of manufacturing a semiconductor device capable of preventing loss of dopants due to external diffusion thereof from a junction area, by forming a cobalt mono-silicide film through a first RTP process, implanting carbon ions not serving as a donor or an acceptor with a low energy and a low dose to make the film amorphous, and then forming a cobalt silicide film through a second RTP process.

2. Discussion of Related Art

Generally, in a logic device, a cobalt silicide film is formed on source/drain regions (active regions), in order to decrease a contact resistance between a unit transistor formed in a lower portion of the device and an upper metal interconnection. As a result, operation speed of the device is enhanced due to improvement of an RC delay characteristic of the device. Only by forming the cobalt silicide film on the source/drain regions (active regions), an ohmic contact is formed in a contact portion between a tungsten plug and the cobalt silicide film, thereby decreasing a contact resistance thereof.

On the other hand, a concentration of dopants in a junction area formed by performing a high concentration n-type or p-type ion implanting process has a large influence on the contact resistance. Here, in case of a high concentration p-type junction area, while the cobalt silicide film is formed in the junction area in which dopants, etc. are distributed in a constant concentration, the cobalt silicide film makes inroads into the concentration distribution formed in the highly-concentrated ion implanting process. On the other hand, ions of $BF_2$ are redistributed due to the subsequent heat budget when or after B and F are separated to form the cobalt silicide film, so that B is externally diffused toward the surface of the cobalt silicide film and F is piled up on an interface between the junction area and the semiconductor substrate. As a result, the roughness of the interface between the junction area and the semiconductor substrate after forming the cobalt silicide film is increased. This causes deterioration of leakage current characteristic in an n-well junction, which is important for characteristics of a device actually implemented.

SUMMARY OF THE INVENTION

Accordingly, the present invention is directed to provide a method of manufacturing a semiconductor device capable of improving element characteristics by forming a cobalt silicide film without loss of dopants.

According to a preferred embodiment of the present invention, there is provided a method of manufacturing a semiconductor device capable of preventing loss of dopants due to external diffusion thereof to improve element characteristics, by forming a cobalt mono-silicide film, performing a carbon ion implanting process to make the cobalt mono-silicide film amorphous, and then forming a cobalt di-silicide film.

In the present invention, by implanting carbon ions not serving as a donor or an acceptor with a low energy and a low dose to make a surface of the cobalt mono-silicide film amorphous after performing a first RTP process for forming a cobalt mono-silicide film and before removing the non-reacting cobalt film and a TiN film, an interfacial roughness of a semiconductor substrate and a poor junction area due to the existing pile-up of F is improved when forming a cobalt di-silicide film or through inducing redistribution of F atoms in a surface direction due to subsequent heat budget.

One aspect of the present invention is to provide a method of manufacturing a semiconductor device, comprising the steps of: forming a gate on a predetermined area of a semiconductor substrate, forming spacers on side walls thereof, and then forming a junction area in a predetermined area of the semiconductor substrate; forming a cobalt film and a buffer layer on the whole structure; forming a cobalt mono-silicide film on the gate and the junction area, by performing a first RTP process; making a surface of the cobalt mono-silicide film amorphous to form an amorphous cobalt silicide film, by performing a carbon ion implanting process; and forming a cobalt di-silicide film, by removing the non-reacting cobalt film and the buffer layer and then performing a second RTP process.

In the aforementioned of a method of manufacturing a semiconductor device according to another embodiment of the present invention, the cobalt film is formed to have a thickness of 70 Å to 150 Å, by keeping a reacting furnace, which initially maintains a pressure of $1 \times 10^{-7}$ to $1 \times 10^{-8}$ Torr, in $1 \times 10^{-2}$ to $1 \times 10^{-4}$ Torr and at from a room temperature to a temperature of 550° C., and by using any one of a DC sputtering method, an RF sputtering method and a CVD method.

In the aforementioned of a method of manufacturing a semiconductor device according to another embodiment of the present invention, the buffer layer is a TiN film.

In the aforementioned of a method of manufacturing a semiconductor device according to another embodiment of the present invention, the TiN film is formed to have a thickness of 100 Å to 500 Å, by keeping a reacting furnace, which initially maintains a pressure of $1 \times 10^{-7}$ to $1 \times 10^{-8}$ Torr, in $1 \times 10^{2}$ to $1 \times 10^{4}$ Torr and at from a room temperature to a temperature of 400° C., and by using any one of a DC sputtering method, an RF sputtering method and a CVD method.

In the aforementioned of a method of manufacturing a semiconductor device according to another embodiment of the present invention, the first RTP process is performed at a temperature of 430° C. to 530° C. for a time of 10 to 60 seconds, by introducing nitrogen gas, argon gas, helium gas and hydrogen gas at a flow rate of 10 to 1000 sccm, respectively.

In the aforementioned of a method of manufacturing a semiconductor device according to another embodiment of the present invention, the carbon ion implanting process is performed up to a depth of 50 Å to 1000 Å with energy of 10 to 10 keV and a dose of $1 \times 10^{14}$ to $1 \times 10^{16}$ atoms/cm$^2$.

In the aforementioned of a method of manufacturing a semiconductor device according to another embodiment of the present invention, the second RTP process is performed at a temperature of 650° C. to 800° C. for a time of 5 to 30 seconds, by introducing nitrogen gas, argon gas, helium gas and hydrogen gas at a flow rate of 10 to 1000 sccm, respectively.

One aspect of the present invention is to provide a method of manufacturing a semiconductor device, comprising the steps of: forming a gate on a predetermined area of a semiconductor substrate, forming spacers on side walls thereof, and then forming a junction area in a predetermined area of the semiconductor substrate; forming an insulating film on the whole structure and then removing the insulating film on an area in which a silicide film should be formed;

forming a cobalt film and a TiN film on the whole structure; making the cobalt film react with the gate and the junction area from which the insulating film is removed and exposed, to form a cobalt mono-silicide film, by performing a first RTP process; making a surface of the cobalt mono-silicide film amorphous to form an amorphous cobalt silicide film, by performing a carbon ion implanting process; and forming a cobalt di-silicide film, by removing the non-reacting cobalt film and the TiN film and then performing a second RTP process.

BRIEF DESCRIPTION OF THE DRAWINGS

The above and other objects, advantages and features of the present invention will become apparent from the following description of preferred embodiments given in conjunction with the accompanying drawings, in which.

DETAILED DESCRIPTION OF PREFERRED EMBODIMENTS

Figure 1A:
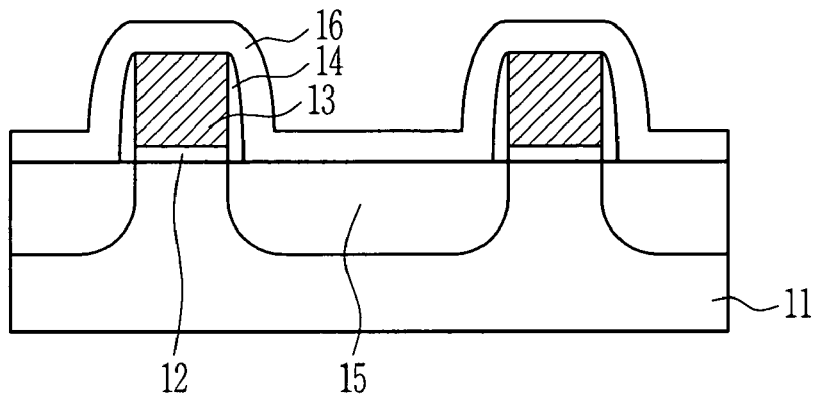
FIGS. 1A to 1E are cross-sectional views sequentially illustrating a method of manufacturing a semiconductor device according to the present invention.

Now, preferred embodiments of the present invention will be described in detail with reference to the accompanying drawings. However, the present invention is not limited to the embodiments disclosed in the following description, but can be implemented into various changes and modifications. Thus, these embodiments are intended to completely inform those skilled in the art of a scope of the present invention. The same reference numerals indicate the same elements in the figures.

FIGS. 1A to 1E are cross-sectional views sequentially illustrating a method of manufacturing a semiconductor device according to the present invention.

Referring to FIG. 1A, a gate oxide film 12 and a poly silicon film 13 are sequentially deposited on a semiconductor substrate 11. The poly silicon film 13 and the gate oxide film 12 are patterned through a photolithograph process and an etching process using a gate mask to form a gate. Spacers 14 are formed on side walls of the gate, and then a high concentration $BF_2$ ion implanting process is performed thereto to form a junction area 15 in the semiconductor substrate 11. Then, an insulating film 16 is formed on the whole structure. At that time, the insulating film 16 is formed for the purpose of preventing a silicide from being formed in specific areas.

Figure 1B:
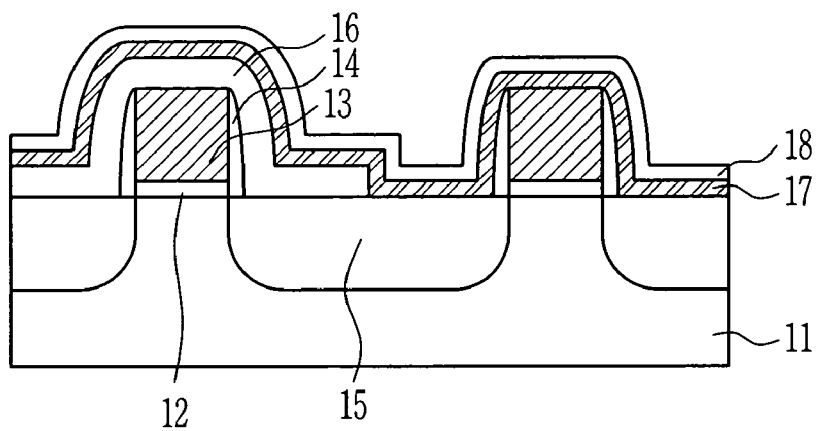

Referring to FIG. 1B, the insulating film 16 in the area in which the silicide film should be formed is removed. Then, a cobalt film 17 is formed on the whole structure, and a TiN film 18 for preventing abnormal oxidation of the cobalt film 17 is formed thereon. As a result, the cobalt film 17 is formed to be in contact with the poly silicon film 13 and the junction area 15 in the area in which the silicide film should be formed. Here, the cobalt film 17 is formed to have a thickness of 70 to 150 Å, by keeping a reacting furnace, which initially maintains a pressure of $1\times10^{-7}$ to $1\times10^{-8}$ Torr, in $1\times10^{-2}$ to $1\times10^{-4}$ Torr and at from a room temperature to a temperature of 550° C., and by using any one of a DC sputtering method, an RF sputtering method and a CVD method. On the other hand, a buffer layer for carbon ion implantation should exist for forming a surface amorphous layer of the present invention. Since the TiN film 18 is used as the buffer layer, a thickness of the TiN film 18 is an important factor. At this time, the TiN film 18 is formed to have a thickness of 100 to 500 Å, by keeping a reacting furnace, which initially maintains a pressure of $1\times10^{-7}$ to $1\times10^{-8}$ Torr, in $1\times10^{2}$ to $1\times10^{4}$ Torr and at from a room temperature to a temperature of 400° C., and by using any one of a DC sputtering method, an RF sputtering method and a CVD method.

Figure 1C:
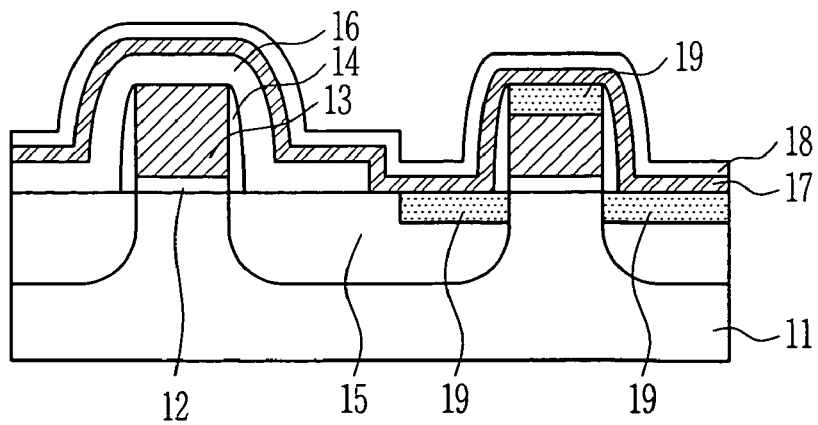
Figure 2A:
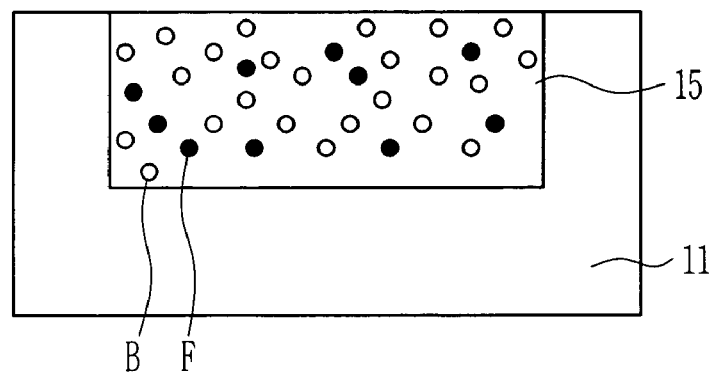
FIG. 2A is a view illustrating an ion distribution of B and F after implanting ions of $BF_2$ to form a junction area.

Referring to FIG. 1C, by performing a first RTP process, the cobalt film 17 is made to react with the poly silicon film 13 and the junction area 15 in the area in which the silicide film should be formed, thereby forming a cobalt mono-silicide film 19. At this time, the first RTP process is performed at a temperature of 430 to 530° C. for a time of 10 to 60 seconds, by introducing nitrogen gas ($N_2$), argon gas (Ar), helium gas (He) and hydrogen gas ($H_2$) at a flow rate of 10 to 1000 sccm, respectively. In this way, atomic distribution of B and F in the junction area 15 on which the cobalt mono-silicide film 19 is formed is equal to that of FIG. 2A.

Figure 1D:
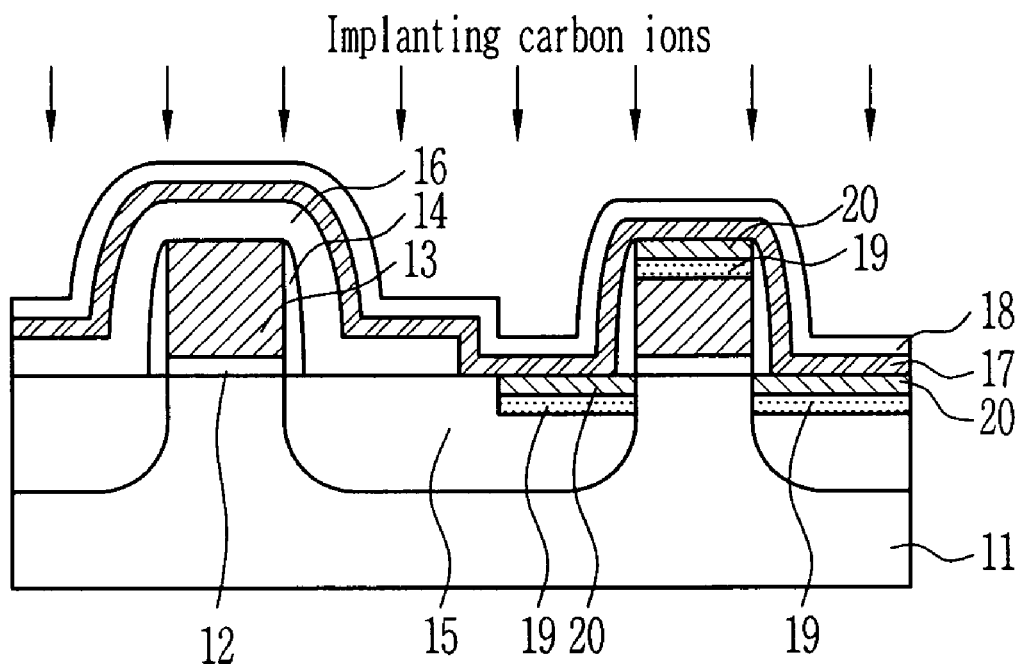
Figure 2B:
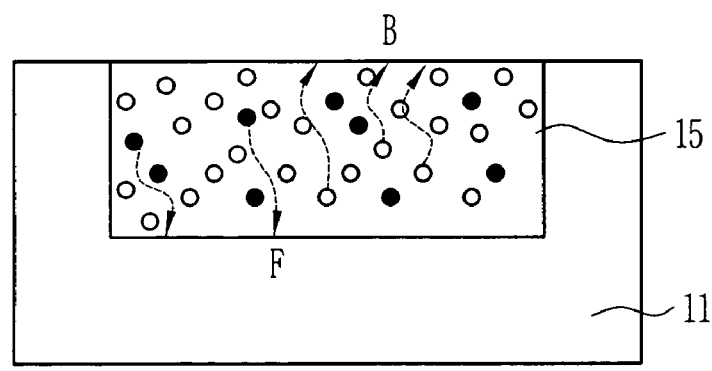
FIG. 2B is a view illustrating diffusion of B and F when a second RTP process is carried out using a conventional process.
Figure 2C:
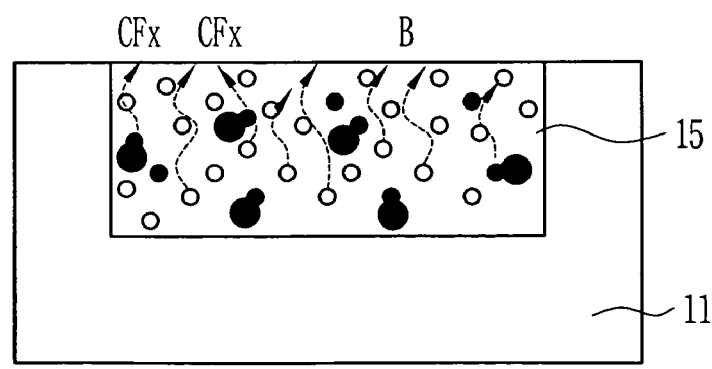
FIG. 2C is a view illustrating a state where CFx is formed and externally diffused through a carbon ion implantation after a first RTP process.

Referring to FIG. 1D, by performing a carbon ion implanting process for making amorphous using the TiN film 18 as a buffer layer for ion implantation, a surface of the cobalt mono-silicide film 19 is made to be amorphous, and thus an amorphous cobalt silicide film 20 is formed. In a general process of forming a cobalt silicide where the additional carbon ion implanting process is not carried out, B is diffused toward the surface thereof and F is diffused toward the semiconductor substrate, as shown in FIG. 2B, when performing a second RTP process. However, as shown in FIG. 2C, the carbon ion implantation makes the cobalt mono-silicide film 19 amorphous and bonds carbons to F atoms in the cobalt mono-silicide film 19 to form CFx. Thereafter, the CFx is externally diffused through the second RTP process. As a result, F atoms do not exist in the cobalt silicide, so that it is possible to form an excellent cobalt silicide film. Here, the carbon ion implanting process is performed up to a depth of 50 to 1000 Å with a low energy of 5 to 100 keV and a low dose of $1\times10^{13}$ to $1\times10^{16}$ atoms/cm$^2$.

Figure 1E:
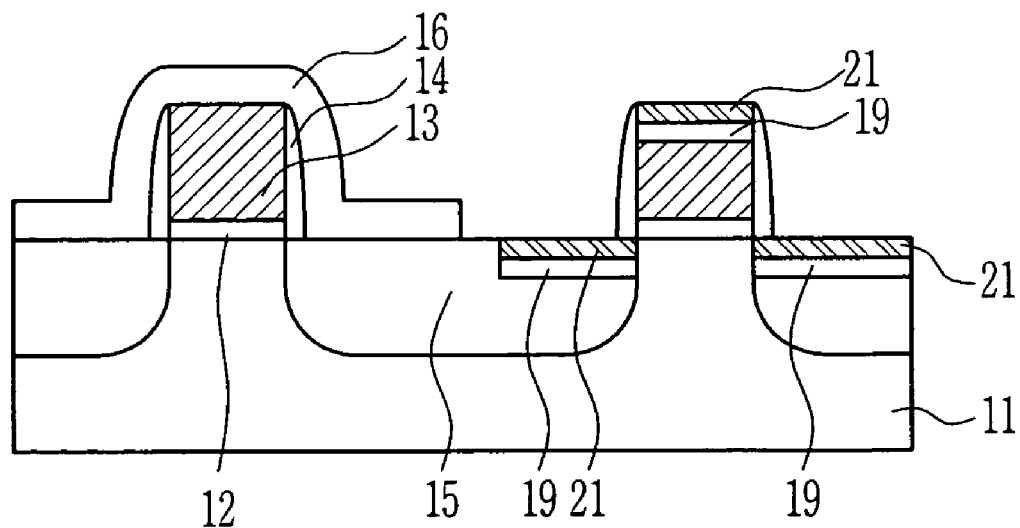

Referring to FIG. 1E, the non-reacting cobalt film 17 and the TiN film 18 are removed, and then the second RTP process is carried out, to form a cobalt di-silicide film 21. At that time, the second RTP process is performed at a temperature of 650 to 800° C. for a time of 5 to 30 seconds, by introducing nitrogen gas ($N_2$), argon gas (Ar), helium gas (He) and hydrogen gas ($H_2$) at a flow rate of 10 to 1000 sccm, respectively.

As described above, according to the present invention, by forming the cobalt mono-silicide film through the first RTP process, implanting carbon ions not serving as a donor or an acceptor with a low energy and a low dose to make the film amorphous, and then forming the cobalt silicide film through the second RTP process, it is possible to prevent loss of dopants due to external diffusion thereof from the junction area. Therefore, since diffusion of F atoms causing deterioration of the interfacial roughness of the junction area and the semiconductor substrate is prevented, it is possible to improve the leakage current characteristic of the junction, it is also possible to improve characteristic of a high-speed logic device, and it is also possible to ensure a characteristic margin of a device, thereby contributing to improvement of yield in mass production thereof. Furthermore, since the TiN capping layer to which the additional carbon ion implanting process according to the present invention is carried out has a more porous property than that to which the conventional process of forming a cobalt silicide film, it is possible to suppress generation of residual materials, which are always disadvantageous when removing the cobalt film and the TiN film, so that it is possible to ensure a process margin enough. On the other hand, in a case of a nickel silicide film to be employed in the future, since the nickel silicide film has physical properties and device characteristics almost equal to the conventional cobalt silicide film, application of the additional ion implanting process for making amorphous according to the present invention to the nickel silicide film will cause improvement of characteristics as much as the cobalt silicide film, or more.

What is claimed is:

1. A method of manufacturing a semiconductor device, comprising:
    forming a gate on a predetermined area of a semiconductor substrate, forming spacers on side walls thereof, and then forming a junction area in a predetermined area of the semiconductor substrate;
    forming a cobalt film and a buffer layer on the whole structure;
    forming a cobalt mono-silicide film on the gate and the junction area, by performing a first RTP process;
    making a surface of the cobalt mono-silicide film amorphous to form an amorphous cobalt silicide film, by performing a carbon ion implanting process; and
    forming a cobalt di-silicide film, by removing the non-reacting cobalt film and the buffer layer and then performing a second RTP process,
    wherein the cobalt film is formed to have a thickness of 70 Å to 150 Å, by keeping a reacting furnace, which initially maintains a pressure of $1\times10^{-7}$ to $1\times10^{-8}$ Torr, in $1\times10^{-2}$ to $1\times10^{-4}$ Torr and at from a room temperature to a temperature of 550° C., and by using any one of a DC sputtering method, an RF sputtering method and a CVD method.

2. A method of manufacturing a semiconductor device according to claim 1, wherein the buffer layer is a TiN film.

3. A method of manufacturing a semiconductor device according to claim 2, wherein the TiN film is formed to have a thickness of 100 Å to 500 Å, by keeping a reacting furnace, which initially maintains a pressure of $1\times10^{-7}$ to $1\times10^{-8}$ Torr, in $1\times10^{2}$ to $1\times10^{4}$ Torr and at from a room temperature to a temperature of 400° C., and by using any one of a DC sputtering method, an RF sputtering method and a CVD method.

4. A method of manufacturing a semiconductor device according to claim 1, wherein the first RTP process is performed at a temperature of 430° C. to 530° C. for a time of 10 to 60 seconds, by introducing nitrogen gas, argon gas, helium gas and hydrogen gas at a flow rate of 10 to 1000 sccm, respectively.

5. A method of manufacturing a semiconductor device according to claim 1, wherein the carbon ion implanting process is performed up to a depth of 50 Å to 1000 Å with an energy of 10 to 100 keV and a dose of $1\times10^{14}$ to $1\times10^{16}$ atoms/cm$^2$.

6. A method of manufacturing a semiconductor device according to claim 1, wherein the second RTP process is performed at a temperature of 650° C. to 800° C. for a time of 5 to 30 seconds, by introducing nitrogen gas, argon gas, helium gas and hydrogen gas at a flow rate of 10 to 1000 sccm, respectively.

7. A method of manufacturing a semiconductor device, comprising the steps of:
    forming a gate on a predetermined area of a semiconductor substrate, forming spacers on side walls thereof, and then forming a junction area in a predetermined area of the semiconductor substrate;
    forming a cobalt film and a buffer layer on the whole structure;
    forming a cobalt mono-silicide film on the gate and the junction area, by performing a first RTP process;
    making a surface of the cobalt mono-silicide film amorphous to form an amorphous cobalt silicide film, by performing a carbon ion implanting process; and
    forming a cobalt di-silicide film, by removing the non-reacting cobalt film and the buffer layer and then performing a second RTP process,
    wherein the carbon ion implanting process is performed up to a depth of 50 Å to 1000 Å with an energy of 10 to 100 keV and a dose of $1\times10^{14}$ to $1\times10^{16}$ atoms/cm$^2$.

8. A method of manufacturing a semiconductor device according to claim 7, wherein the cobalt film is formed to have a thickness of 70 Å to 150 Å, by keeping a reacting furnace, which initially maintains a pressure of $1\times10^{-7}$ to $1\times10^{-8}$ Torr, in $1\times10^{-2}$ to $1\times10^{-4}$ Torr and at from a room temperature to a temperature of 550° C., and by using any one of a DC sputtering method, an RF sputtering method and a CVD method.

9. A method of manufacturing a semiconductor device according to claim 7, wherein the buffer layer is a TiN film.

10. A method of manufacturing a semiconductor device according to claim 9, wherein the TiN film is formed to have a thickness of 100 Å to 500 Å, by keeping a reacting furnace, which initially maintains a pressure of $1\times10^{-7}$ to $1\times10^{-8}$ Torr, in $1\times10^{2}$ to $1\times10^{4}$ Torr and at from a room temperature to a temperature of 400° C., and by using any one of a DC sputtering method, an RF sputtering method and a CVD method.

11. A method of manufacturing a semiconductor device according to claim 7, wherein the first RTP process is performed at a temperature of 430° C. to 530° C. for a time of 10 to 60 seconds, by introducing nitrogen gas, argon gas, helium gas and hydrogen gas at a flow rate of 10 to 1000 sccm, respectively.

12. A method of manufacturing a semiconductor device according to claim 7, wherein the second RTP process is performed at a temperature of 650° C. to 800° C. for a time of 5 to 30 seconds, by introducing nitrogen gas, argon gas, helium gas and hydrogen gas at a flow rate of 10 to 1000 sccm, respectively.

13. A method of manufacturing a semiconductor device, comprising the steps of:
    forming a gate on a predetermined area of a semiconductor substrate, forming spacers on side walls thereof, and then forming a junction area in a predetermined area of the semiconductor substrate;
    forming an insulating film on the whole structure and then removing the insulating film on an area in which a silicide film should be formed;
    forming a cobalt film and a TiN film on the whole structure;
    making the cobalt film react with the gate and the junction area from which the insulating film is removed and exposed, to form a cobalt mono-silicide film, by performing a first RTP process;
    making a surface of the cobalt mono-silicide film amorphous to form an amorphous cobalt silicide film, by performing a carbon ion implanting process; and forming a cobalt di-silicide film, by removing the non-reacting cobalt film and the TiN film and then performing a second RTP process,
wherein the carbon ion implanting process is performed up to a depth of 50 Å to 1000 Å with an energy of 10 to 100 keV and a dose of $1\times10^{14}$ to $1\times10^{16}$ atoms/cm$^2$.

14. A method of manufacturing a semiconductor device according to claim 13, wherein the cobalt film is formed to have a thickness of 70 Å to 150 Å, by keeping a reacting furnace, which initially maintains a pressure of $1\times10^{-7}$ to $1\times10^{-8}$ Torr, in $1\times10^{-2}$ to $1\times10^{10-4}$ Torr and at from a room temperature to a temperature of 550° C., and by using any one of a DC sputtering method, an RF sputtering method and a CVD method.

15. A method of manufacturing a semiconductor device according to claim 13, wherein the TiN film is formed to have a thickness of 100 Å to 500 Å, by keeping a reacting furnace, which initially maintains a pressure of $1\times10^{-7}$ to $1\times10^{-8}$ Torr, in $1\times10^{2}$ to $1\times10^{4}$ Torr and at from a room temperature to a temperature of 400° C., and by using any one of a DC sputtering method, an RF sputtering method and a CVD method.

16. A method of manufacturing a semiconductor device according to claim 13, wherein the first RTP process is performed at a temperature of 430° C. to 530° C. for a time of 10 to 60 seconds, by introducing nitrogen gas, argon gas, helium gas and hydrogen gas at a flow rate of 10 to 1000 sccm, respectively.

17. A method of manufacturing a semiconductor device according to claim 13, wherein the second RTP process is performed at a temperature of 650° C. to 800° C. for a time of 5 to 30 seconds, by introducing nitrogen gas, argon gas, helium gas and hydrogen gas at a flow rate of 10 to 1000 sccm, respectively.

* * * * *